United States Patent
Ching et al.

(12) 
(10) Patent No.: US 9,881,993 B2
(45) Date of Patent: Jan. 30, 2018

(54) METHOD OF FORMING SEMICONDUCTOR STRUCTURE WITH HORIZONTAL GATE ALL AROUND STRUCTURE

(71) Applicant: Taiwan Semiconductor Manufacturing Company Limited, Hsinchu (TW)

(72) Inventors: Kuo-Cheng Ching, Hsinchu County (TW); Ching-Wei Tsai, Hsinchu (TW); Chih-Hao Wang, Hsinshu County (TW); Carlos H. Diaz, Mountain View, CA (US)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 222 days.

(21) Appl. No.: 14/317,069

(22) Filed: Jun. 27, 2014

(65) Prior Publication Data

US 2015/0380313 A1   Dec. 31, 2015

(51) Int. Cl.
*H01L 29/06* (2006.01)
*H01L 29/78* (2006.01)
(Continued)

(52) U.S. Cl.
CPC .... *H01L 29/0615* (2013.01); *H01L 21/76224* (2013.01); *H01L 21/823418* (2013.01);
(Continued)

(58) Field of Classification Search
CPC ............... H01L 21/823418–21/823431; H01L 21/823814–21/823821;
(Continued)

(56) References Cited

U.S. PATENT DOCUMENTS

| | | | |
|---|---|---|---|
| 2012/0138886 A1* | 6/2012 | Kuhn | B82Y 10/00 257/9 |
| 2013/0161756 A1* | 6/2013 | Glass | H01L 29/66545 257/369 |

(Continued)

*Primary Examiner* — Steven Loke
*Assistant Examiner* — Juanita Rhodes
(74) *Attorney, Agent, or Firm* — Jones Day (57) ABSTRACT

A method of forming a semiconductor device having a horizontal gate all around structure on a bulk substrate is provided. The method comprises forming a plurality of fins on a bulk substrate wherein each fin comprises a vertical slice of substrate material and a plurality of channel layers above the vertical slice of substrate material. The plurality of channel layers includes a top channel layer above a bottom channel layer. Each channel layer comprises a first sublayer of removable semiconductor material overlaid by a second sublayer of semiconductor material. The method further comprises providing shallow trench isolation (STI) material between the vertical slices of the bulk substrate in the plurality of fins, depositing poly material around a central portion of the plurality of fins, forming source and drain regions, and forming an interlayer dielectric layer (ILD0). The method also comprises removing the poly material, forming a plurality of channels from the channel layers, and forming a gate around the channels.

19 Claims, 10 Drawing Sheets

(51) Int. Cl.
    *H01L 29/66*     (2006.01)
    *H01L 29/423*     (2006.01)
    *H01L 29/10*     (2006.01)
    *H01L 29/167*     (2006.01)
    *H01L 21/762*     (2006.01)
    *H01L 21/8234*     (2006.01)
    *H01L 29/267*     (2006.01)

(52) U.S. Cl.
    CPC ........... *H01L 21/823431* (2013.01); *H01L 21/823481* (2013.01); *H01L 29/0673* (2013.01); *H01L 29/1054* (2013.01); *H01L 29/167* (2013.01); *H01L 29/267* (2013.01); *H01L 29/42392* (2013.01); *H01L 29/66795* (2013.01); *H01L 29/785* (2013.01)

(58) Field of Classification Search
    CPC ...... H01L 27/0886–27/0924; H01L 27/10826; H01L 27/10879; H01L 27/1211; H01L 29/41791; H01L 29/66772; H01L 29/7831; H01L 29/785; H01L 2029/7857–2029/7858; H01L 2924/13067; H01L 21/845; H01L 29/0615; H01L 29/66795; H01L 29/42392; H01L 29/0673; H01L 29/1054; H01L 29/167; H01L 21/76224; H01L 21/823481; H01L 29/267; H01L 21/82418
    See application file for complete search history.

(56) References Cited

U.S. PATENT DOCUMENTS

| | | | |
|---|---|---|---|
| 2014/0131660 A1* | 5/2014 | Cea | H01L 29/42392 257/24 |
| 2015/0228480 A1* | 8/2015 | Yin | H01L 29/00 438/283 |
| 2015/0372104 A1* | 12/2015 | Liu | H01L 29/42364 257/77 |

* cited by examiner

METHOD OF FORMING SEMICONDUCTOR STRUCTURE WITH HORIZONTAL GATE ALL AROUND STRUCTURE

BACKGROUND

The technology described in this patent document relates generally to semiconductor devices and more particularly to fabricating a transistor with a horizontal gate all around structure.

Scaling of semiconductor devices, such as a metal-oxide semiconductor field-effect transistor (MOSFET), has enabled continued improvement in speed, performance, density, and cost per unit function of integrated circuits over the past few decades. Development of improved fabrication techniques can further the scaling of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
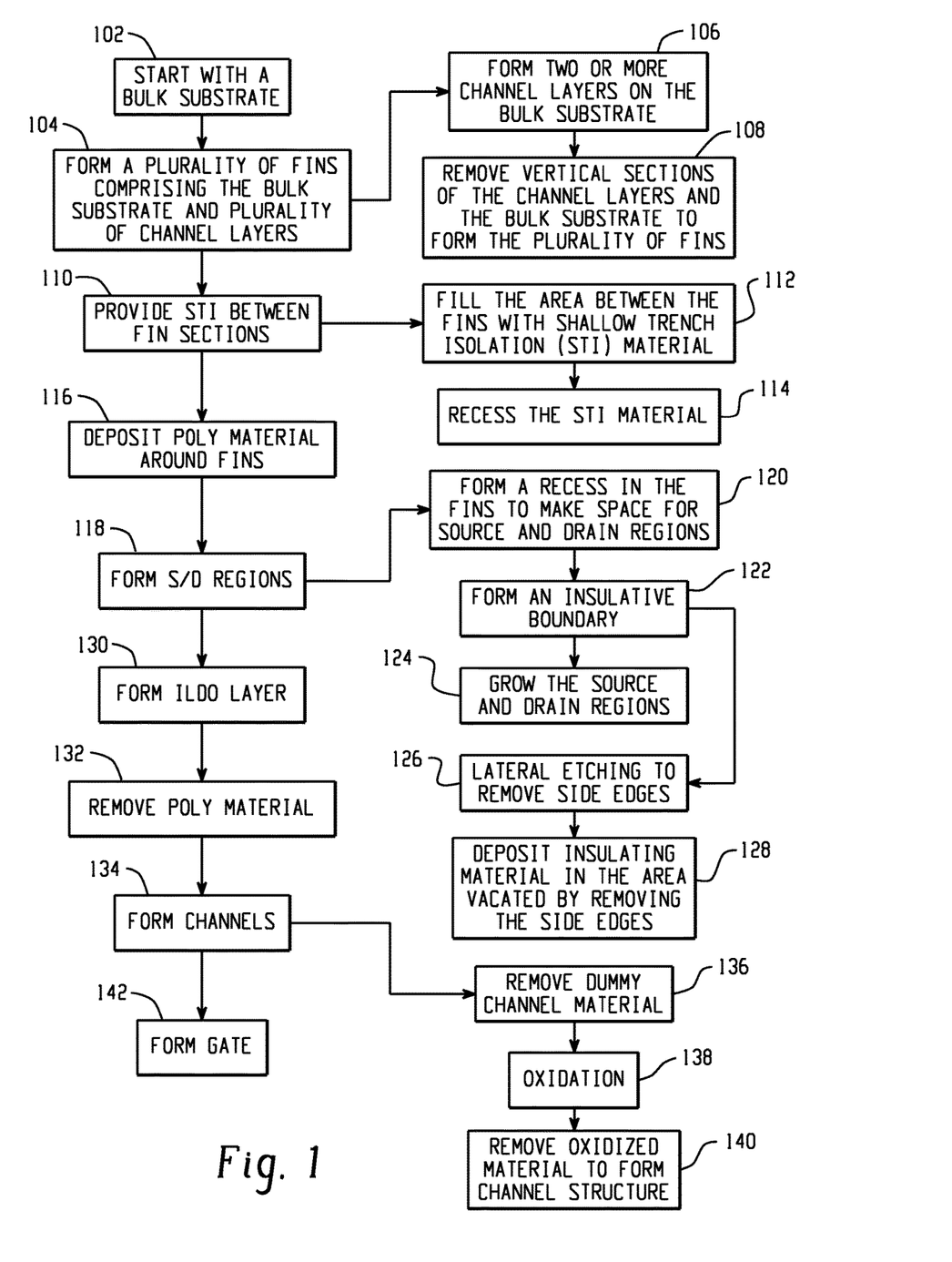
FIG. 1 is a process flow chart illustrating an example method of forming a semiconductor device having a horizontal gate all around structure on a bulk substrate, in accordance with some embodiments.

FIG. 1 is a process flow chart illustrating an example method of forming a semiconductor device having a horizontal gate all around structure on a bulk substrate. The method begins with the provision of a bulk substrate (operation 102). A plurality of fins is then formed on the bulk substrate (operation 104). Each fin comprises a vertical slice of substrate material and one or more channel layers above the vertical slice of substrate material. In this example, two channel layers are formed, a top channel layer and a bottom channel layer with the top channel layer positioned above the bottom channel layer. Each channel layer comprises a first sublayer of removable semiconductor material overlaid by a second sublayer of semiconductor material.

The fins are formed by first forming the one or more channel layers on the bulk substrate (operation 106) and then by removing vertical sections of the channel layers and the bulk substrate (operation 108). The structure that remains is the bulk substrate with vertically extending fins. In this example, the channel layers and sublayers are formed on the bulk substrate by epitaxial growth operations. Also in this example, the bulk substrate is a silicon substrate, the first sublayer comprises SiGe and the second sublayer comprises Si. Also, in this example, a hard mask is formed above the top channel layer.

Figure 2:
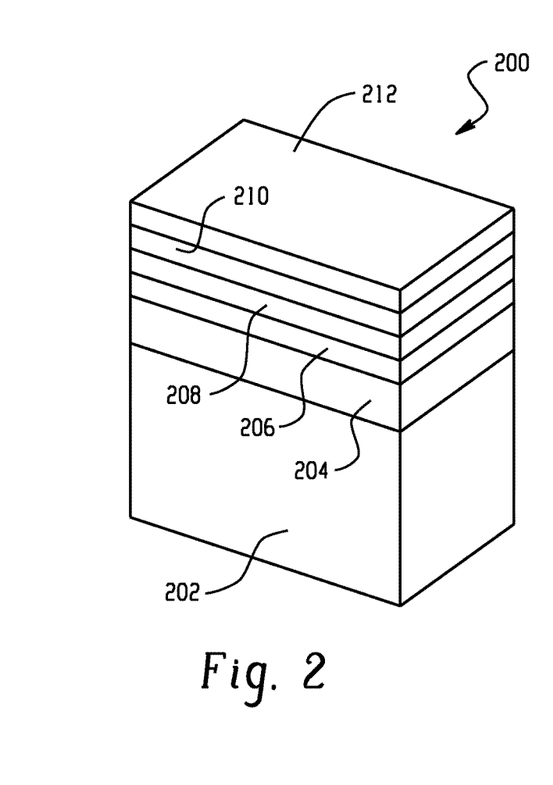
FIG. 2 is a block diagram of an example semiconductor structure at one stage during fabrication of a semiconductor device having a horizontal gate all around structure, in accordance with some embodiments.

FIG. 2 is a block diagram of an example semiconductor structure at one stage during fabrication of a semiconductor device having a horizontal gate all around structure. This diagram illustrates an example semiconductor structure after one or more channel layers are formed on a bulk substrate (e.g., operation 106 of FIG. 1). Shown is the example semiconductor structure 200 with a bulk substrate 202, a first sublayer 204 of a first layer containing removable semiconductor material, a second sublayer 206 of the first layer containing semiconductor material, a first sublayer 208 of a second layer containing removable semiconductor material, a second sublayer 210 of the second layer containing semiconductor material, and a hard mask 212.

Figure 3:
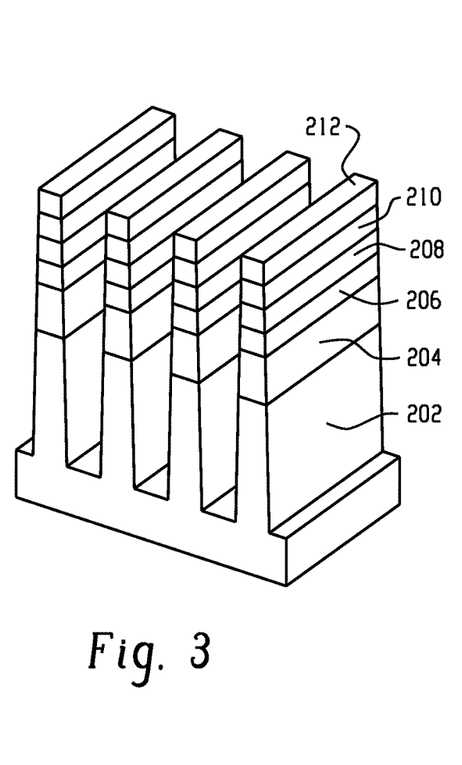
FIG. 3 is a block diagram of an example semiconductor structure at another stage during fabrication of a semiconductor device having a horizontal gate all around structure, in accordance with some embodiments.

FIG. 3 is a block diagram of an example semiconductor structure at another stage during fabrication of a semiconductor device having a horizontal gate all around structure. This diagram illustrates an example semiconductor structure after the fins are formed by removing vertical sections of the channel layers and the bulk substrate (e.g., operation 108 of FIG. 1). Shown is an example semiconductor structure with four fins wherein each fin comprises a vertical slice of the bulk substrate 202, a first channel layer above the slice of the bulk substrate comprising a slice of the first sublayer 204 and a slice of the second sublayer 206, a second channel layer above the first channel layer comprising a slice of the first sublayer 208 and a slice of the second sublayer 210, and a slice of the hard mask 212 above the second channel layer.

Referring back to FIG. 1, after formation of the fins, shallow trench isolation (STI) material is provided between the vertical slices of the bulk substrate in the plurality of fins (operation 110). This may be accomplished by filling the area between the fins with shallow trench isolation (STI) material (operation 112) and creating a recess in the in the STI material so that the STI material extends above the vertical slices of the bulk substrate but below the vertical slices of the second sublayer of semiconductor material in the bottom channel layer (operation 114). Filling the area between the fins with shallow trench isolation (STI) material may involve chemical mechanical polishing (CMP) operations to shape the STI and removing the hard mask from above the second channel layer.

Figure 4:
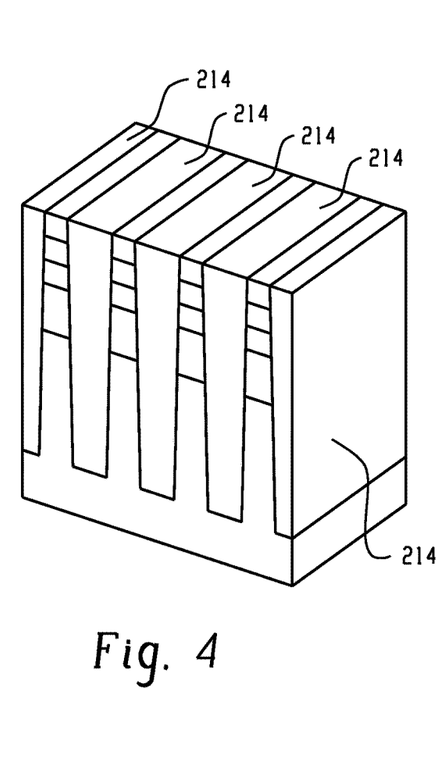
FIG. 4 is a block diagram of an example semiconductor structure at another stage during fabrication of a semiconductor device having a horizontal gate all around structure, in accordance with some embodiments.

FIG. 4 is a block diagram of an example semiconductor structure at another stage during fabrication of a semiconductor device having a horizontal gate all around structure. This diagram illustrates an example semiconductor structure after filling the area between the fins with shallow trench isolation (STI) material (e.g., operation 112 of FIG. 1). Shown is the example semiconductor structure with STI material 214.

Figure 5:
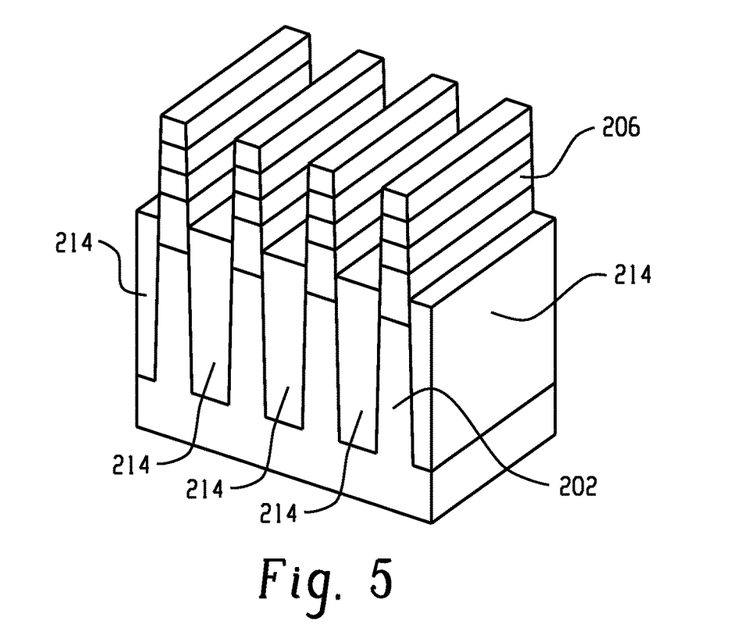
FIG. 5 is a block diagram of an example semiconductor structure at another stage during fabrication of a semiconductor device having a horizontal gate all around structure, in accordance with some embodiments.

FIG. 5 is a block diagram of an example semiconductor structure at another stage during fabrication of a semiconductor device having a horizontal gate all around structure. This diagram illustrates an example semiconductor structure after recessing the STI material (e.g., operation 114 of FIG. 1). Shown is the example semiconductor structure with STI material 214 recessed such that the STI material 214 extends above the vertical slices of the bulk substrate 202 but below the vertical slices of the second sublayer 206 in the bottom layer.

Referring back to FIG. 1, after providing STI between fin sections, poly material is deposited around a central portion of the plurality of fins (operation 116). A hard mask may also be formed over the poly material. Spacer material may also be formed around the poly material.

Figure 6:
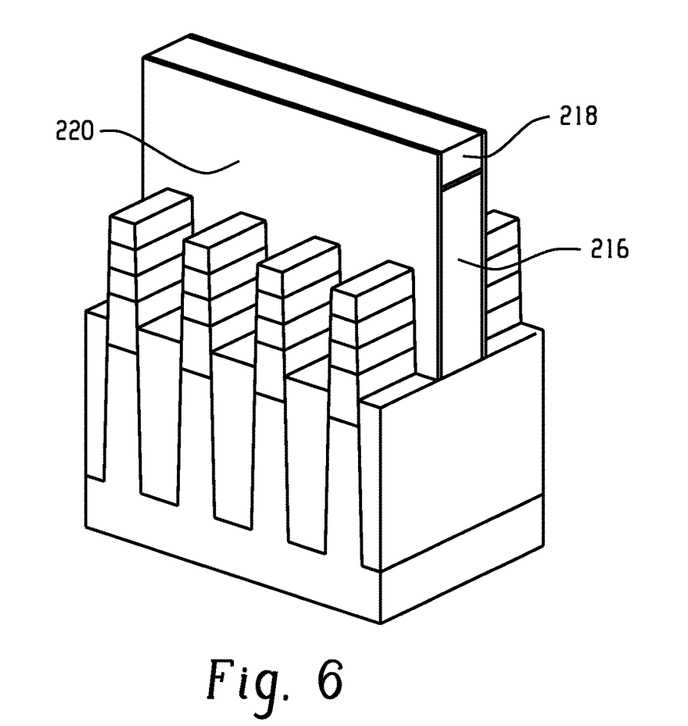
FIG. 6 is a block diagram of an example semiconductor structure at another stage during fabrication of a semiconductor device having a horizontal gate all around structure, in accordance with some embodiments.

FIG. 6 is a block diagram of an example semiconductor structure at another stage during fabrication of a semiconductor device having a horizontal gate all around structure. This diagram illustrates an example semiconductor structure after poly material 216 is deposited around a central portion of the plurality of fins (e.g., operation 116 of FIG. 1). Shown is the example semiconductor structure with STI material 214, poly material 216, hard mask 218, and spacer material 220.

Referring back to FIG. 1, formation of the source and drain regions take place (operation 118). This may be accomplished by creating a recess in the plurality of fins to make space for source and drain regions (operation 120), forming an insulative boundary around each first sublayer of removable semiconductor material in the central portion of the plurality of fins (operation 122), and growing the source and drain (S/D) regions (operation 124), for example, using epitaxial growth operations. The S/D material may comprise SiP for NFET and SiGeB for PFET.

Creating a recess in the plurality of fins to make space for source and drain regions may involve removing from the plurality of fins the plurality of channel layers above the vertical slice of substrate material in regions of the plurality of fins not surrounded by the poly material.

Forming an insulative boundary around each first sublayer of removable semiconductor material in the central portion of the plurality of fins may involve removing side edges from each first sublayer of removable semiconductor material by lateral etching operations (operation 126) and depositing insulating material in the area vacated by removing the side edges (operation 128). Depositing insulating material in the area vacated by removing the side edges may also involve removing excess insulating material by dry etching operations. The insulating material may comprises SiN.

Figure 7A:
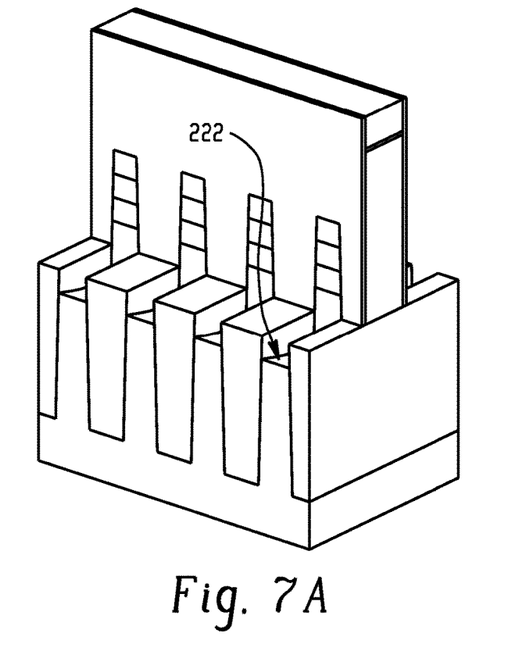
FIG. 7A is a block diagram of an example semiconductor structure at another stage during fabrication of a semiconductor device having a horizontal gate all around structure, in accordance with some embodiments.
Figure 7B:
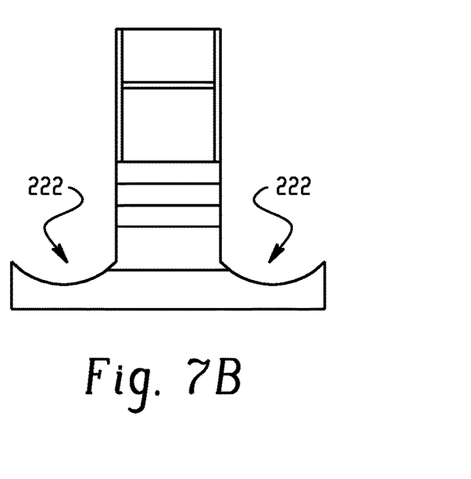
FIG. 7B represents a cross sectional view of a portion of the semiconductor structure of FIG. 7A, in accordance with some embodiments.

FIG. 7A is a block diagram of an example semiconductor structure at another stage during fabrication of a semiconductor device having a horizontal gate all around structure. This diagram illustrates an example semiconductor structure after S/D recess formation (e.g., operation 120 of FIG. 1). FIG. 7B represents a cross sectional view of a portion of the semiconductor structure of FIG. 7A. These figures show recesses 222 formed where channel layers in the fins previously existed.

Figure 8A:
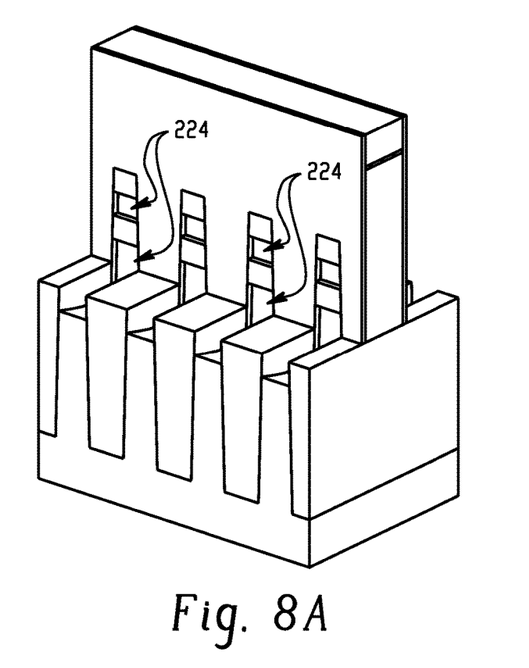
FIG. 8A is a block diagram of an example semiconductor structure at another stage during fabrication of a semiconductor device having a horizontal gate all around structure, in accordance with some embodiments.
Figure 8B:
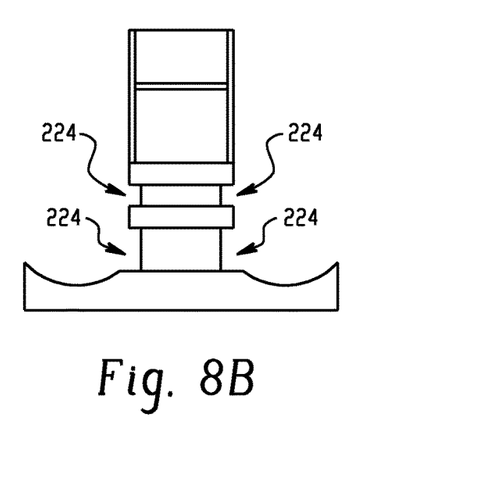
FIG. 8B represents a cross sectional view of a portion of the semiconductor structure of FIG. 8A, in accordance with some embodiments.

FIG. 8A is a block diagram of an example semiconductor structure at another stage during fabrication of a semiconductor device having a horizontal gate all around structure. This diagram illustrates an example semiconductor structure after removing side edges from each first sublayer of removable semiconductor material by lateral etching operations (e.g., operation 126 of FIG. 1). FIG. 8B represents a cross sectional view of a portion of the semiconductor structure of FIG. 8A. These figures show recesses 224 where side edges from the first sublayers previously existed.

Figure 9A:
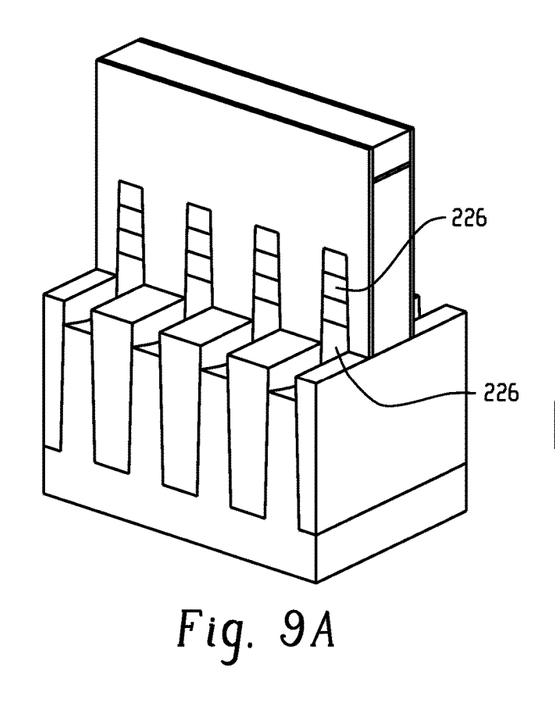
FIG. 9A is a block diagram of an example semiconductor structure at another stage during fabrication of a semiconductor device having a horizontal gate all around structure, in accordance with some embodiments.
Figure 9B:
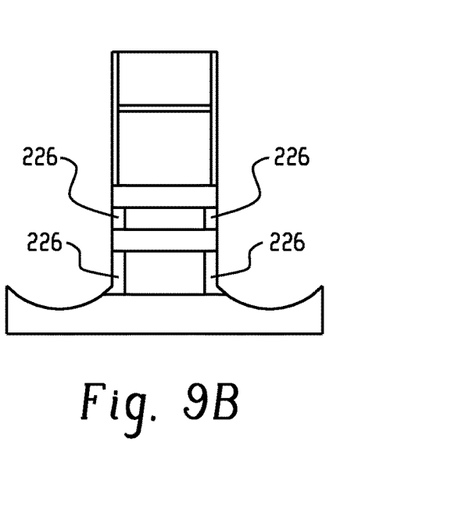
FIG. 9B represents a cross sectional view of a portion of the semiconductor structure of FIG. 9A, in accordance with some embodiments.

FIG. 9A is a block diagram of an example semiconductor structure at another stage during fabrication of a semiconductor device having a horizontal gate all around structure. This diagram illustrates an example semiconductor structure after depositing insulating material in the area vacated by removing the side edges (e.g., operation 128 of FIG. 1). FIG. 9B represents a cross sectional view of a portion of the semiconductor structure of FIG. 9A. These figures show insulating material 226 at side edges.

Figure 10A:
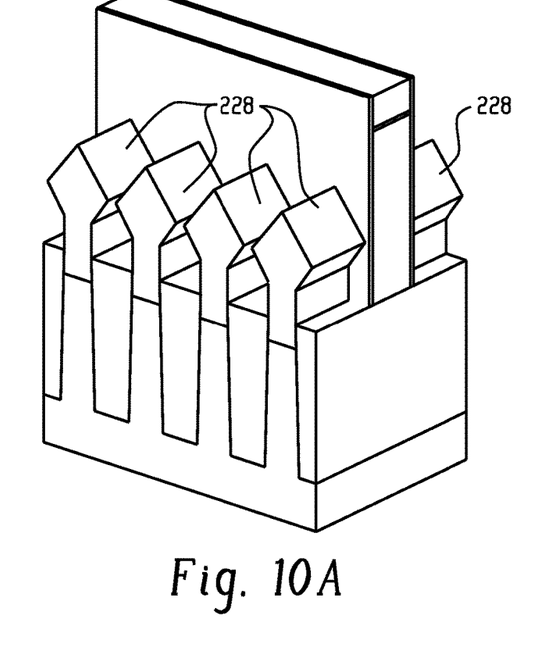
FIG. 10A is a block diagram of an example semiconductor structure at another stage during fabrication of a semiconductor device having a horizontal gate all around structure, in accordance with some embodiments.
Figure 10B:
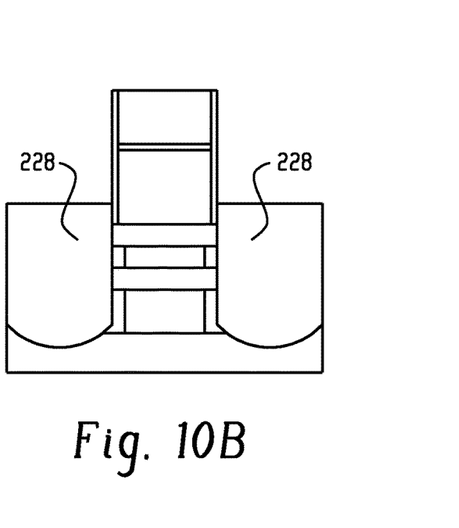
FIG. 10B represents a cross sectional view of a portion of the semiconductor structure of FIG. 10A, in accordance with some embodiments.

FIG. 10A is a block diagram of an example semiconductor structure at another stage during fabrication of a semiconductor device having a horizontal gate all around structure. This diagram illustrates an example semiconductor structure after S/D growth (e.g., operation 124 of FIG. 1). FIG. 10B represents a cross sectional view of a portion of the semiconductor structure of FIG. 10A. These figures show the formation of source and drain regions 228.

Referring back to FIG. 1, after S/D region formation, interlayer dielectric layer (ILD0) formation may take place (operation 130), followed by poly material removal (operation 132). Interlayer dielectric layer (ILD0) formation may involve depositing ILD0 material and shaping the ILD0 using CMP operations.

Figures 11A, 11B:
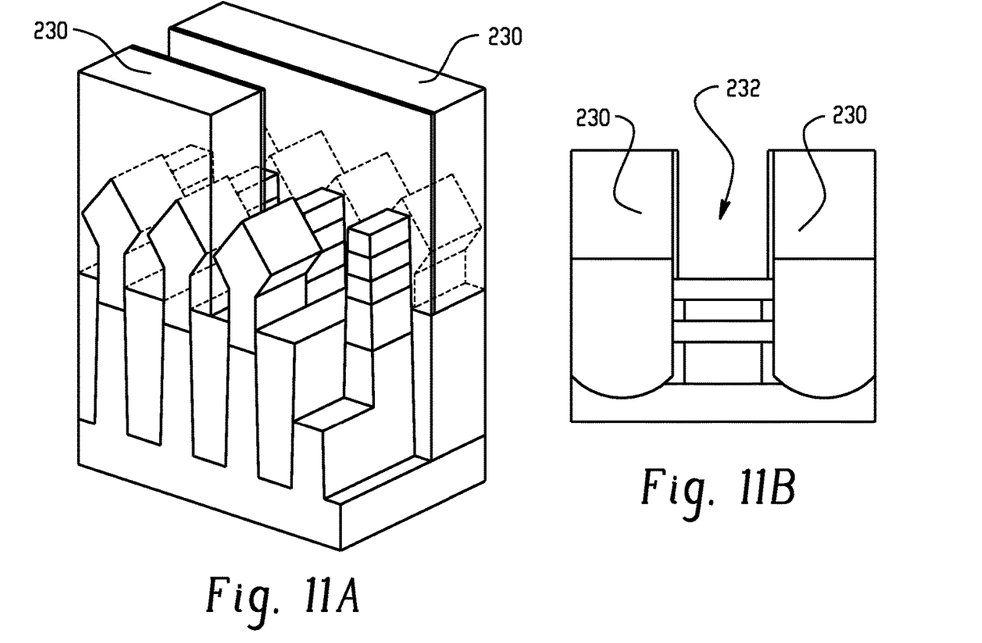
FIG. 11A is a block diagram of an example semiconductor structure at another stage during fabrication of a semiconductor device having a horizontal gate all around structure, in accordance with some embodiments.
FIG. 11B represents a cross sectional view of a portion of the semiconductor structure of FIG. 11A, in accordance with some embodiments.

FIG. 11A is a block diagram of an example semiconductor structure at another stage during fabrication of a semiconductor device having a horizontal gate all around structure. This diagram illustrates an example semiconductor structure after ILD0 formation (e.g., operation 130 of FIG. 1) and the removal of the poly material (e.g., operation 132 of FIG. 1). FIG. 11B represents a cross sectional view of a portion of the semiconductor structure of FIG. 11A. These figures show the addition of the ILD0 layer 230 and a void 232 where the poly material previously existed.

Referring back to FIG. 1, channel formation (operation 134) takes place. Channel formation involves removing first sublayer material from each fin (operation 136), oxidizing the first sublayer material at the boundary between the first sublayer of the bottom layer and the substrate in each fin and oxidizing the second sublayer material in each fin (operation 138), and removing oxidized material from the oxidized second sublayers material to form a plurality of horizontal nanowires from the second sublayers (operation 140).

Figures 12A, 12B:
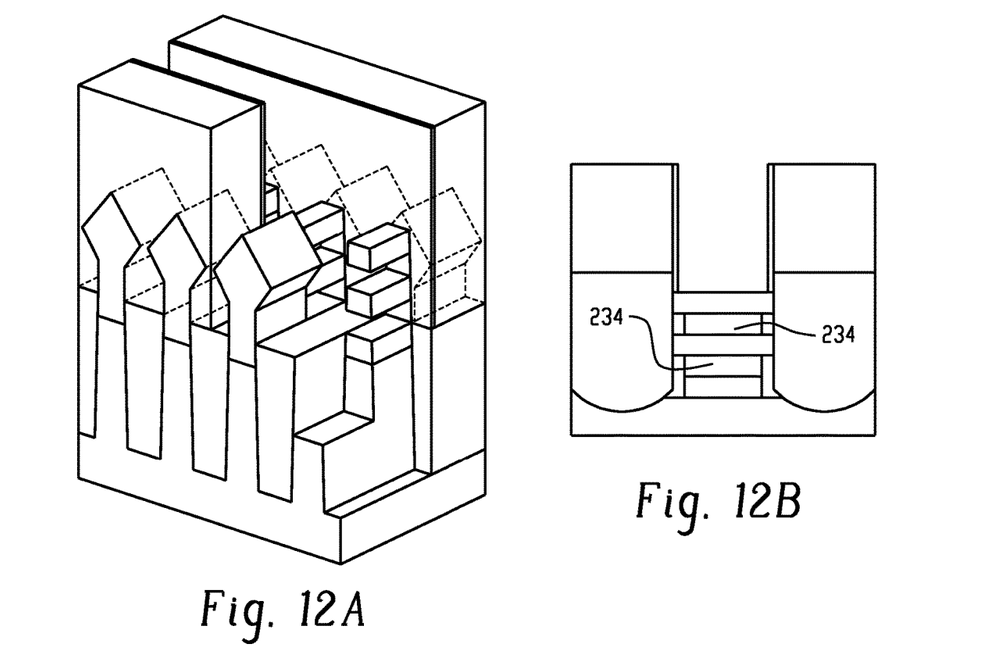
FIG. 12A is a block diagram of an example semiconductor structure at another stage during fabrication of a semiconductor device having a horizontal gate all around structure, in accordance with some embodiments.
FIG. 12B represents a cross sectional view of a portion of the semiconductor structure of FIG. 12A, in accordance with some embodiments.

FIG. 12A is a block diagram of an example semiconductor structure at another stage during fabrication of a semiconductor device having a horizontal gate all around structure. This diagram illustrates an example semiconductor structure after removing first sublayer material from each fin (e.g., operation 136 of FIG. 1). In this example, SiGe is removed. FIG. 12B represents a cross sectional view of a portion of the semiconductor structure of FIG. 12A. These figures show voids 234 where first sublayer material previously existed.

Figure 13A:
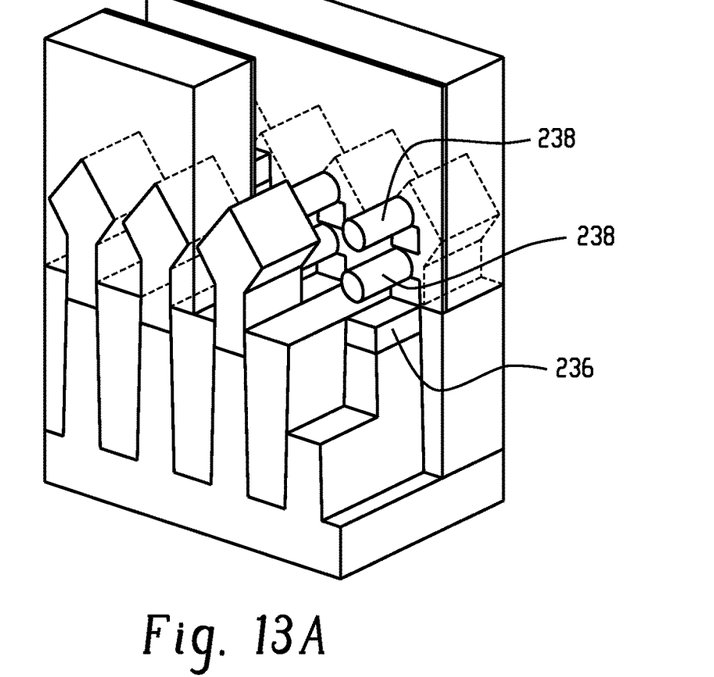
FIG. 13A is a block diagram of an example semiconductor structure at another stage during fabrication of a semiconductor device having a horizontal gate all around structure, in accordance with some embodiments.
Figure 13B:
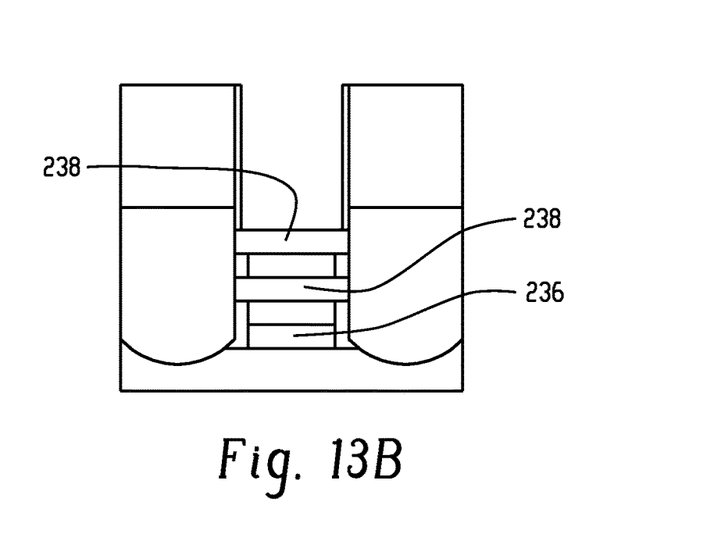
FIG. 13B represents a cross sectional view of a portion of the semiconductor structure of FIG. 13A, in accordance with some embodiments.

FIG. 13A is a block diagram of an example semiconductor structure at another stage during fabrication of a semiconductor device having a horizontal gate all around structure. This diagram illustrates an example semiconductor structure after oxidation (e.g., operation 138 of FIG. 1) and oxide removal (e.g., operation 140 of FIG. 1). FIG. 13B represents a cross sectional view of a portion of the semiconductor structure of FIG. 13A. These figures show an oxidized first sublayer material 236 at the boundary between the first layer and the substrate and also show the nanowires 238 formed as a result of oxide removal.

Referring back to FIG. 1, metal gate formation (operation 142) takes place. Metal gate formation involves forming a gate around the channels, which may include depositing an interfacial layer (IL) dielectric with a high K (HK) value and depositing metal gate (MG) material.

Figures 14A, 14B:
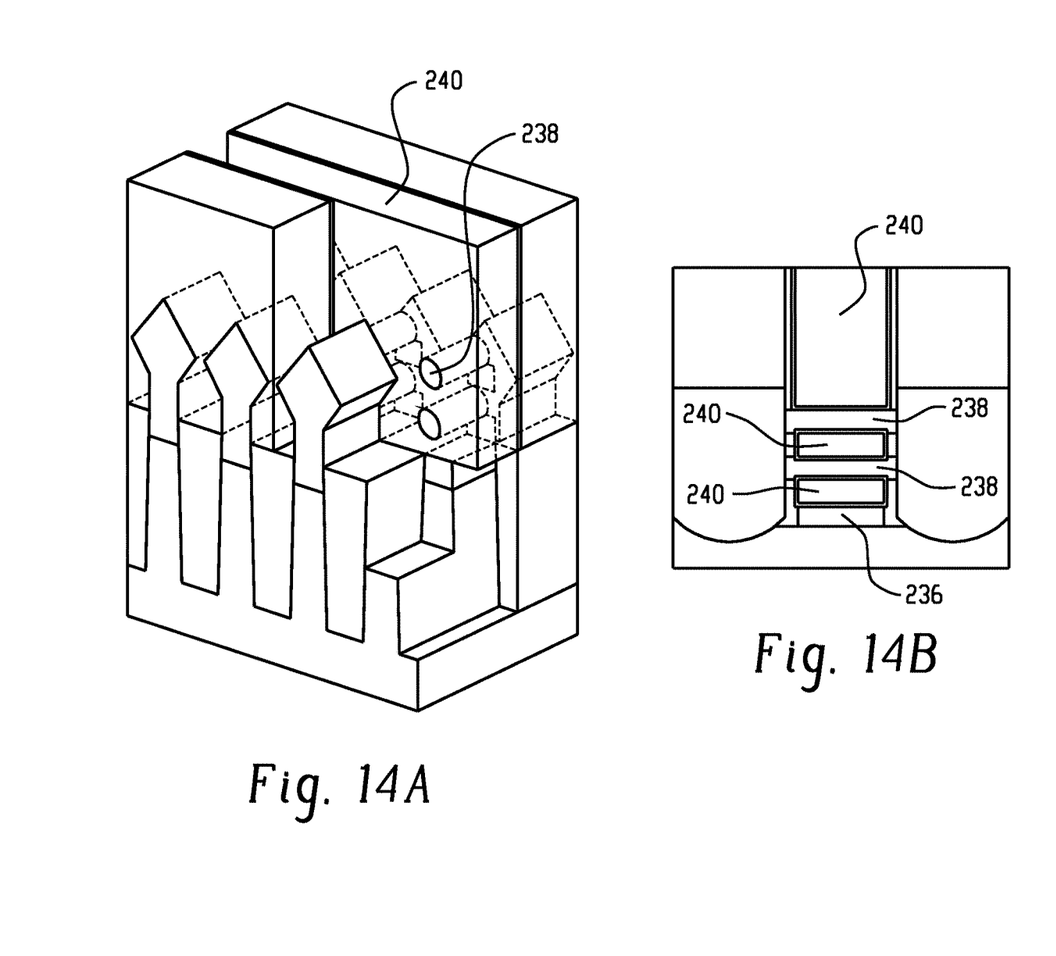
FIG. 14A is a block diagram of an example semiconductor structure at another stage during fabrication of a semiconductor device having a horizontal gate all around structure, in accordance with some embodiments.
FIG. 14B represents a cross sectional view of a portion of the semiconductor structure of FIG. 14A, in accordance with some embodiments.
Figure 14C:
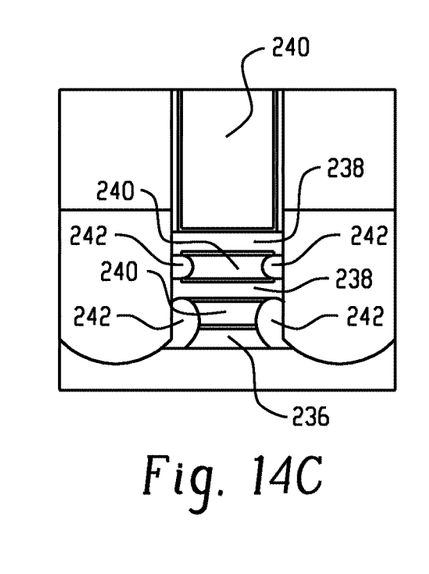
FIG. 14C represents another cross sectional view of a portion of the semiconductor structure of FIG. 14A, in accordance with some embodiments.

FIG. 14A is a block diagram of an example semiconductor structure at another stage during fabrication of a semiconductor device having a horizontal gate all around structure. This diagram illustrates an example semiconductor structure after metal gate formation (e.g., operation 142 of FIG. 1). FIG. 14B represents a cross sectional view of a portion of the semiconductor structure of FIG. 14A. FIG. 14C represents a cross sectional view of another portion of the semiconductor structure of FIG. 14A and in particular shows spacers 242. Shown in these figures are metal gate material 240 formed around the nanowire channels 238, spacers 242 for reducing the risk of bridging between the gate 240 and S/D regions 228, and the oxide layer 236 (e.g., SiGeOx) for substrate isolation and parasitic capacitance reduction. In this example, the diameter of the channel 238 is 4-8 nm. The thickness of the bottom metal gate 240 is 3-15 nm. The thickness of the oxide layer 236 (e.g., SiGeOx) is 2-10 nm. The width of the internal spacer 242 is 2-7 nm.

Figure 15:
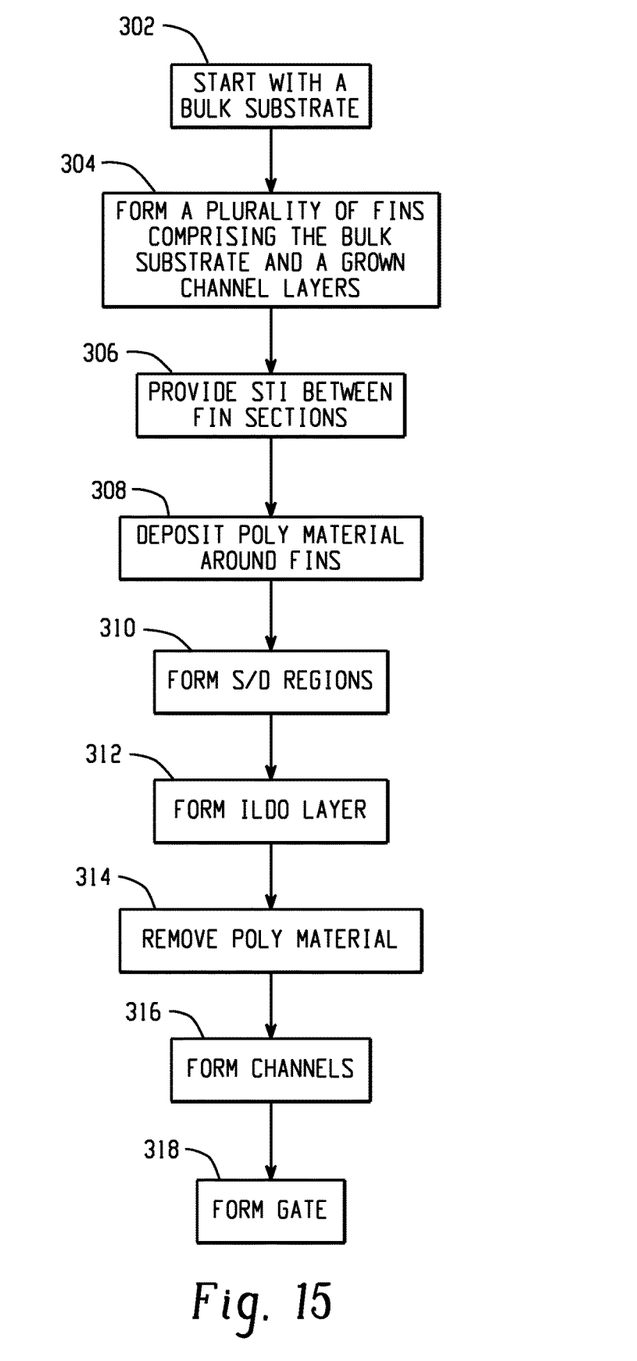
FIG. 15 is a process flow chart illustrated an example method for forming a semiconductor device having a horizontal gate all around structure on a bulk substrate, in accordance with some embodiments.

FIG. 15 is a process flow chart illustrating an example method of forming a semiconductor device having a horizontal gate all around structure on a bulk substrate. In this example, the semiconductor device has a quad gate structure wherein instead of the channel comprising a plurality of horizontal extending nanowires, the channel comprises a wider channel structure in each of the fins.

The method begins with the provision of a bulk substrate (operation 302). A plurality of fins is then formed on the bulk substrate (operation 304). Each fin comprises a vertical slice of substrate material and a single channel layer above the vertical slice of substrate material. The channel layer comprises a first sublayer of removable semiconductor material overlaid by a second sublayer of semiconductor material. After formation of the fins, shallow trench isolation (STI) material is provided between the vertical slices of the bulk substrate in the plurality of fins (operation 306).

Next, poly material is deposited around a central portion of the plurality of fins (operation 308). A hard mask may also be formed over the poly material. Spacer material may also be formed around the poly material.

Next, formation of the source and drain (S/D) regions take place (operation 310). This may be accomplished by creating a recess in the plurality of fins to make space for source and drain regions, forming an insulative boundary around each first sublayer of removable semiconductor material in the central portion of the plurality of fins, followed by growing the S/D regions, for example, using epitaxial growth operations. The S/D material may comprise SiP for NFET and SiGeB for PFET.

After S/D region formation, interlayer dielectric layer (ILD0) formation may take place (operation 312). Interlayer dielectric layer (ILD0) formation may involve depositing ILD0 material and shaping the ILD0 using CMP operations.

Next, poly material removal (operation 314) take place. Channel formation (operation 316) follows poly material removal. Channel formation involves removing first sublayer material from each fin, oxidizing the first sublayer material at the boundary between the first sublayer and the substrate in each fin, oxidizing the second sublayer material in each fin, and removing oxidized material from the oxidized second sublayers material to form a channel from the second sublayer.

Metal gate formation (operation 318) follows channel formation. Metal gate formation involves forming a gate around the channels, which may include depositing an interfacial layer (IL) dielectric with a high K (HK) value and depositing metal gate (MG) material.

Figure 16A:
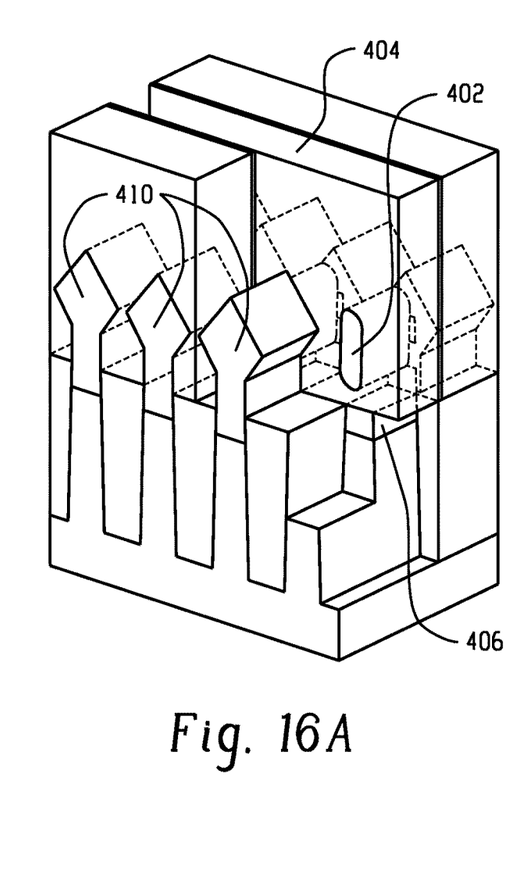
FIG. 16A is a block diagram of an example semiconductor structure at one stage during fabrication of a semiconductor device having a horizontal gate all around structure, in accordance with some embodiments.
Figure 16B:
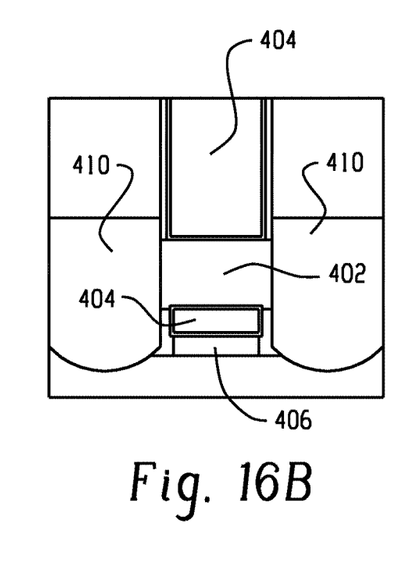
FIG. 16B represents a cross sectional view of a portion of the semiconductor structure of FIG. 16A, in accordance with some embodiments.
Figure 16C:
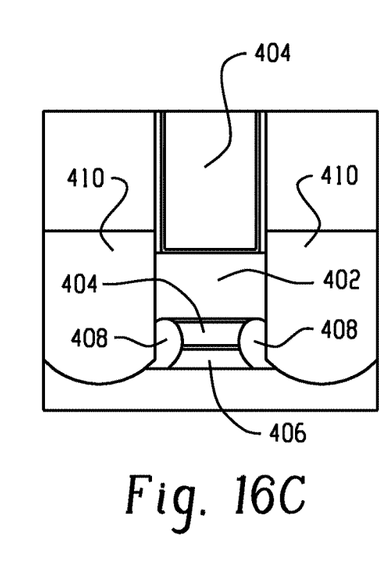
FIG. 16C represents another cross sectional view of a portion of the semiconductor structure of FIG. 16A, in accordance with some embodiments.

FIG. 16A is a block diagram of an example semiconductor structure after metal gate formation (e.g., operation 318 of FIG. 15). FIG. 16B represents a cross sectional view of a portion of the semiconductor structure of FIG. 16A. FIG. 16C represents a cross sectional view of another portion of the semiconductor structure of FIG. 16A and in particular shows spacers 408. In this example, the horizontal channel 402 has a greater surface area than that of the example semiconductor structure formed via the method of FIG. 1. In this example, the height of the channel 402 is 10-30 nm. The thickness of the bottom metal gate 404 is 3-15 nm. The thickness of the oxide layer 406 (e.g., SiGeOx) is 2-10 nm. The width of the internal spacer 408 is 2-7 nm. Shown in these figures are metal gate material 404 formed around the channel 402, spacers 406 for reducing the risk of bridging between the gate 404 and S/D regions 410, and the oxide layer 406 (e.g., SiGeOx) for substrate isolation and parasitic capacitance reduction.

Described herein are methods for fabricating a semiconductor structure having a horizontal gate all around (GAA) structure with multiple nanowires (e.g., >2 wires) for a bulk Si wafer. In some examples, to reduce the gate to S/D bridge risk and to reduce parasitic capacitance, an internal spacer may be formed between the bottom MG and the S/D region. In addition, the bottom SiGeOx may be formed for substrate isolation and parasitic capacitance reduction. A similar methodology may be used for fabricating a semiconductor structure having a horizontal gate all around (GAA) structure with a quad-gate structure.

In one embodiment, disclosed is a method of forming a semiconductor device having a horizontal gate all around structure on a bulk substrate. The method comprises forming a plurality of fins on a bulk substrate wherein each fin comprises a vertical slice of substrate material and a plurality of channel layers above the vertical slice of substrate material. The plurality of channel layers includes a top channel layer above a bottom channel layer. Each channel layer comprises a first sublayer of removable semiconductor material overlaid by a second sublayer of semiconductor material. The method further comprises providing shallow trench isolation (STI) material between the vertical slices of the bulk substrate in the plurality of fins, depositing poly material around a central portion of the plurality of fins, forming source and drain regions, and forming an interlayer dielectric layer (ILD0). The method also comprises removing the poly material, forming a plurality of channels from the channel layers, and forming a gate around the channels.

These aspects and other embodiments may include one or more of the following features. The bulk substrate may comprise Si, the first sublayer may comprise SiGe, and the second sublayer may comprise Si. The "forming a plurality of fins on a bulk substrate" may comprise forming the plurality of channel layers on the bulk substrate and removing vertical sections of the channel layers and the bulk substrate to form the plurality of fins. The "providing shallow trench isolation (STI) material between the vertical slices of the bulk substrate in the plurality of fins" may comprise filling the area vacated by the removal of the vertical sections with shallow trench isolation (STI) material and creating a recess in the in the STI material so that the STI material extends above the vertical slices of the bulk substrate but below the vertical slices of the second sublayer of semiconductor material in the bottom channel layer. The "providing shallow trench isolation (STI) material between the vertical slices of the bulk substrate in the plurality of fins" may comprise filling the area vacated by the removal of the vertical sections with shallow trench isolation (STI) material above the height of the vertical slices of the bulk substrate but below the height level of the vertical slices of the second sublayer of semiconductor material in the bottom channel layer. The "forming the source and drain regions" may comprise creating a recess in the plurality of fins to make space for source and drain regions. The "creating a recess in the plurality of fins to make space for source and drain regions" may comprise removing from the plurality of fins the plurality of channel layers above the vertical slice of substrate material in regions of the plurality of fins not surrounded by the poly material. The "forming the source and drain regions" may comprise forming an insulative boundary around each first sublayer of removable semiconductor material in the central portion of the plurality of fins. The insulative boundary may comprise SiN. The "forming the source and drain regions" may comprise growing the source and drain regions using epitaxial growth operations. The device is may be an NFET and the source and drain material may comprise SiP. The device may be a PFET and the source and drain material may comprise SiGeB. The "forming a plurality of channels from the channel layers" may comprise removing first sublayer material from each fin. The "forming a plurality of channels from the channel layers" may comprise oxidizing the second sublayer material in each fin and removing oxidized material from the oxidized second sublayer material to form a plurality of horizontal nanowires from the second sublayer material.

In another embodiment, a method of forming a semiconductor device having a horizontal gate all around structure on a bulk substrate is provided. The method comprises forming a plurality of fins on a bulk substrate. Each fin comprises a vertical slice of substrate material and a single channel layer above the vertical slice of substrate material. The channel layer includes a first sublayer of removable semiconductor material overlaid by a second sublayer of semiconductor material. The method further comprises providing shallow trench isolation (STI) material between the vertical slices of the bulk substrate in the plurality of fins, depositing poly material around a central portion of the plurality of fins, forming source and drain regions, and forming an interlayer dielectric layer (ILD0). The method additionally comprises removing the poly material, forming a channel from the channel layer in each fin, and forming a gate around the channel.

These aspects and other embodiments may include one or more of the following features. The "forming a channel from the channel layer in each fin" may comprise removing first sublayer material from each fin. The "forming a channel from the channel layer" may comprise oxidizing the second sublayer material in each fin and removing oxidized material from the oxidized second sublayer material to form a horizontally extending channel region from the second sublayer material.

In another embodiment, a method of forming a semiconductor structure is disclosed. The method comprises forming a plurality of fins on a substrate. Each fin comprises a vertical slice of substrate material and one or more channel layers above the vertical slice of substrate material. Each channel layer includes a first sublayer of removable semiconductor material overlaid by a second sublayer of semiconductor material. The method further comprises providing shallow trench isolation (STI) material between the vertical slices of the bulk substrate in the plurality of fins, depositing poly material around a central portion of the plurality of fins, forming source and drain regions, and forming an interlayer dielectric layer (ILD0). The method additionally comprises removing the poly material, forming a channel from the one or more channel layers in each fin, and forming a gate around the channel.

These aspects and other embodiments may include one or more of the following features. The "forming a channel from the one or more channel layers in each fin" may comprise oxidizing the second sublayer material in each fin and removing oxidized material from the oxidized second sublayer material to form a horizontally extending channel region from the second sublayer material. The "forming a channel from the one or more channel layers in each fin" may comprise oxidizing the second sublayer material in each fin and removing oxidized material from the oxidized second sublayer material to form a plurality of horizontal nanowires from the second sublayer material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a multilayer structure comprising
        a horizontal top portion of a substrate,
        a first layer of removable semiconductor material over the substrate's horizontal top portion, and
        a second layer of semiconductor material over the first layer of removable semiconductor material;
    forming parallel trenches in the multilayer structure, wherein the parallel trenches extend vertically through the multilayer structure to define multilayer fins, each multilayer fin is located between a respective pair of neighboring parallel trenches from among the parallel trenches, and each multilayer fin includes the substrate's horizontal top portion, the first layer of removable semiconductor material over the substrate's horizontal top portion, and the second layer of semiconductor material over the first layer of removable semiconductor material;
    providing shallow trench isolation material in each trench of the parallel trenches;
    depositing poly material around a central portion of each multilayer fin;
    forming source and drain regions at horizontally-opposite end sections of each multilayer fin;
    forming, at opposite sides of the poly material, an interlayer dielectric layer over the source and drain regions;
    removing the poly material;
    forming the second layer of semiconductor material of each multilayer fin into a channel;
    forming, between the source and drain regions, a gate around the channel of each multilayer fin; and
    covering an end of the first layer of removable semiconductor material of each multilayer fin with an insulating material before forming the source and drain regions, so that after forming the source and drain regions, the insulating material is between the end of the first layer of removable semiconductor material and a source of the source and drain regions.

2. The method of claim 1, wherein the substrate comprises Si, the first layer of removable semiconductor material comprises SiGe, and the second layer of semiconductor material comprises Si.

3. The method of claim 1, wherein providing the shallow trench isolation material comprises filling the parallel trenches with shallow trench isolation material and removing an upper portion of the shallow trench isolation material so that the shallow trench isolation material extends above the substrate but below the second layer of semiconductor material.

4. The method of claim 1, wherein providing the shallow trench isolation material comprises filling the parallel trenches with shallow trench isolation material above the substrate.

5. The method of claim 1, wherein forming the source and drain regions comprises removing opposite end sections of each multilayer fin to create a recess in each multilayer fin to make space for the source and drain regions, and each of the horizontally-opposite end sections of each multilayer fin is not surrounded by the poly material.

6. The method of claim 1, wherein forming the source and drain regions comprises forming the insulating material of SiN.

7. The method of claim 1, wherein forming the source and drain regions comprises growing the source and drain regions using epitaxial growth operations.

8. The method of claim 1, wherein the multilayer structure is an NFET and the source and drain regions comprise SiP.

9. The method of claim 1, wherein the multilayer structure is a PFET and the source and drain regions comprise SiGeB.

10. The method of claim 1, wherein forming the second layer of semiconductor material of each multilayer fin into a channel comprises removing at least a portion of the first layer of removable semiconductor material from each multilayer fin.

11. The method of claim 1, wherein forming the second layer of semiconductor material of each multilayer fin into a channel comprises oxidizing the second layer of semiconductor material in each multilayer fin and removing oxidized material from the oxidized second layer of semiconductor material to form a plurality of horizontal nanowires from the second layer of semiconductor material.

12. A method comprising:
forming a multilayer structure comprising
a horizontal top portion of a substrate,
a first layer of removable semiconductor material over the substrate's horizontal top portion, and
a second layer of semiconductor material over the first layer of removable semiconductor material;
forming a pair of parallel trenches in the multilayer structure, wherein the pair of parallel trenches extend vertically through the multilayer structure to define a multilayer fin that is located between the pair of parallel trenches, the multilayer fin including the substrate's horizontal top portion, the first layer of removable semiconductor material over the substrate's horizontal top portion, and the second layer of semiconductor material over the first layer of removable semiconductor material;
providing shallow trench isolation material in each trench of the pair of parallel trenches;
depositing poly material around a central portion of the multilayer fin;
forming source and drain regions at opposite ends of the multilayer fin;
forming, at opposite sides of the poly material, an interlayer dielectric layer over the source and drain regions;
removing the poly material;
forming the second layer of semiconductor material into a channel; and
forming, between the source and drain regions, a gate around the channel of the multilayer fin;
covering an end of the first layer of removable semiconductor material of the multilayer fin with an insulating material before forming the source and drain regions, so that after forming the source and drain regions, the insulating material is between the end of the first layer of removable semiconductor material and a source of the source and drain regions.

13. The method of claim 12, wherein forming the second layer of semiconductor material into the channel comprises removing at least a portion of the first layer of removable semiconductor material.

14. The method of claim 12, wherein forming the second layer of semiconductor material into the channel comprises oxidizing the second layer of semiconductor material and removing oxidized material from the oxidized second layer of semiconductor material to form a horizontally extending channel region from the second layer of semiconductor material.

15. A method comprising:
forming a multilayer structure comprising
a horizontal top portion of a substrate,
a first layer of removable semiconductor material over the substrate's horizontal top portion, and
a second layer of semiconductor material over the first layer of removable semiconductor material;
forming a pair of parallel trenches in the multilayer structure, wherein the pair of parallel trenches extend vertically through the multilayer structure to define a multilayer fin located between the pair of parallel trenches, and the multilayer fin includes the substrate's horizontal top portion, the first layer of removable semiconductor material over the substrate's horizontal top portion, and the second layer of semiconductor material over the first layer of removable semiconductor material;
providing shallow trench isolation material in each trench of the pair of parallel trenches, such that
a lower portion of the first layer of removable semiconductor material is below a top of the shallow trench isolation material, and
an upper portion of the first layer of removable semiconductor material is above the top of the shallow trench isolation material;
depositing poly material around a central portion of the multilayer fin;
forming source and drain regions at opposite ends of the multilayer fin;
removing the poly material;
converting the lower portion of the first layer of removable semiconductor material, that is below the top of the shallow trench isolation material, to oxidized material;
replacing the upper portion of the first layer of removable semiconductor material, that is above the top of the shallow trench isolation material, with a void;
forming the second layer of semiconductor material of the multilayer fin into a channel; and
forming, between the source and drain regions, a gate around the channel and into the void.

16. The method of claim 15, wherein forming the second layer of semiconductor material of the multilayer fin into a channel comprises oxidizing the second layer of semiconductor material in the multilayer fin and removing oxidized material from the oxidized second layer of semiconductor material to form a horizontal nanowire from the second layer of semiconductor material.

17. The method of claim 1, wherein forming the interlayer dielectric layer results in an interface, between the interlayer dielectric layer and the shallow trench isolation material, that is above a bottom of the first layer of removable semiconductor material and below a top of the first layer of removable semiconductor material.

18. The method of claim 1 wherein, the multilayer structure further comprises:
a third layer of the removable semiconductor material, formed over the second layer of semiconductor material, and
a fourth layer of the semiconductor material, formed over the third layer of the removable semiconductor material,
such that each multilayer fin further includes the third layer of the removable semiconductor material over the second layer of semiconductor material and the fourth layer of the semiconductor material over the third layer of the removable semiconductor material.

19. The method of claim 15, further comprising:
covering an end of the first layer of removable semiconductor material of the multilayer fin with an insulating material before forming the source and drain regions, so that after forming the source and drain regions, the insulating material is between the end of the first layer of removable semiconductor material and a source of the source and drain regions.

* * * * *